United States Patent [19] [11] Patent Number: 4,951,106
Blouke [45] Date of Patent: Aug. 21, 1990

[54] DETECTOR DEVICE FOR MEASURING THE INTENSITY OF ELECTROMAGNETIC RADIATION

[75] Inventor: Morley M. Blouke, Beaverton, Oreg.

[73] Assignee: Tektronix, Inc., Beaverton, Oreg.

[21] Appl. No.: 172,511

[22] Filed: Mar. 24, 1988

[51] Int. Cl.⁵ ..................... H01L 27/14; H01L 29/78; H01L 29/06
[52] U.S. Cl. ...................................... 357/30; 357/20; 357/24; 357/29; 357/48; 357/51
[58] Field of Search ................. 357/30 D, 30 G, 30 J, 357/30 R, 29, 24 LR, 24, 24 M, 20, 48, 51, 52

[56] References Cited

U.S. PATENT DOCUMENTS 3,400,383  9/1968  Meadows et al. ................ 357/30 G
3,689,772  9/1972  George et al. .
3,728,590  4/1973  Kim et al. .
4,631,592  12/1986  Nishizawa ......................... 357/30 R
4,665,325  5/1987  Yamada et al. ................... 357/30 R
4,878,120  10/1989  Matsumoto ........................ 357/30

FOREIGN PATENT DOCUMENTS 59-188278  10/1984  Japan ............................... 357/30 D

OTHER PUBLICATIONS

H. Heyns et al., "The Resistive Gate CTD Area-Image Sensor", IEEE Trans. Electron. Devices, ED-25, pp. 135-139, Feb. 1978.
J. A. Higgins et al., "Resistive Gate GaAs Charge Coupled Devices", GaAs IC Symposium, IEEE, pp. 49-52, 1982.

Primary Examiner—Andrew J. James
Assistant Examiner—Ngan Van Ngo
Attorney, Agent, or Firm—John Smith-Hill; Peter J. Meza

[57] ABSTRACT

An interferometer comprises an optical system for generating an interference pattern of a predetermined configuration in a focal plane of the interferometer, and a detector device for measuring the distribution of optical power over the focal plane. The detector device comprises a body of semiconductor material having first and second opposite main surfaces, one of which surfaces lies substantially in the focal plane of the interferometer. The body of semiconductor material has a region of a first conductivity type and a channel of a second, opposite conductivity type at the first surface thereof and bounded by the region of the first conductivity type. The configuration of the channel conforms substantially to the predetermined configuration of the interference pattern. The semiconductor material responds to electromagnetic radiation in a given spectral region by generating charge carriers. Charge carriers that are created in or diffuse into the channel are confined in the channel. A layer of dielectric material is formed on the first surface of the body of semiconductor material and overlies the channel. A layer of resistive material is disposed over the layer of dielectric material, the layer having two terminal regions such that when opposite terminals of a DC potential source are connected to those terminal regions, an electric field that extends longitudinally of the channel is created, so that charge carriers are transported along the channel to an end region thereof. An output device has a charge collection region adjacent to the end region of the channel.

11 Claims, 2 Drawing Sheets

DETECTOR DEVICE FOR MEASURING THE INTENSITY OF ELECTROMAGNETIC RADIATION

BACKGROUND OF THE INVENTION

This invention relates to a detector device for measuring the intensity of electromagnetic radiation.

It is known to use an imaging charge-coupled device (CCD) to generate an electrical signal representative of the distribution of light intensity in the image plane of a lens. One form of imaging CCD comprises a silicon die which has been processed using conventional MOS technology to form a plurality of buried channels beneath its front surface (the surface through which the die is processed). Each channel is made up of a linear array of like elementary regions. A clocking electrode structure overlies the front surface of the die, and by application of selected potentials to the clocking electrode structure, charge present in a given elementary region of a channel may be advanced through the linear array of elementary regions, in the manner of a shift register, and extracted from the channel. In an imaging CCD, charges are generated in the channels photoelectrically. Thus, if a photon enters the die, it may cause generation of conduction electrons and these conduction electrons may enter a channel layer and become confined in one of the elementary channel regions.

The imaging CCD is placed with one of its surfaces at the focal plane of a camera so that the camera lens forms an image of a scene on that surface. The CCD may comprise, e.g., 64 parallel channels each having 64 elementary regions and the resulting 64 × 64 array of elementary regions resolves the image receiving surface of the die into 64 × 64 picture elements or pixels. The camera has a shutter which is opened for a predetermined exposure interval, during which all electrodes of the clocking electrode structure remain at constant potentials. The shutter is then closed, and the charge accumulated in the elementary channel regions is clocked out of the CCD. The intensity of the optical energy incident on a given pixel during the exposure interval can influence the electron population of the associated elementary region of the channel layer, and so the number of electrons that are transferred out of the elementary region, and ultimately extracted from the CCD, is representative of the intensity of the light incident on the pixel. In this manner, the CCD can be used to generate a two-dimensionally sampled electrical signal representative of the distribution of light intensity over the image receiving surface of the CCD, i.e., of the image formed by the camera lens.

An imaging CCD of the type that has previously been described is useful for providing a signal that represents an arbitrary image. However, such an imaging CCD is complex in its structure and is difficult to fabricate.

When a Fabry-Perot etalon is illuminated using collimated monochromatic light and the transmitted beams are brought to a focus, a pattern of interference fringes is observed in the focal plane. The fringes are circular and concentric and the spacing between the fringes is a function of the wavelength of the illuminating light and the separation of the etalon plates. Accordingly, the image produced from such a light source using a Fabry-Perot etalon is not arbitrary.

In a conventional CCD, in which adjacent clocking gate electrodes are electrically isolated from each other, potential barriers may exist between adjacent clocking gate electrodes, and these barriers may interfere with transfer of charge through the device under control of the clocking gate electrodes. U.S. Pat. No. 3,728,590 issued Apr. 17, 1973 (Kim et al) discloses a CCD in which resistive material is provided between, and is electrically connected to, adjacent clocking gate electrodes. Use of the resistive material eliminates potential barriers between the clocking gate electrodes. H. Heyns and J. G. Van Santen, The Resistive Gate CTD Area-Image Sensor, IEEE Trans. Electron. Devices, ED-25, 135–139, Feb. 1978, describes use of a resistive gate to control transfer of charge in an imaging CCD. J. A. Higgins, R. A. Milano, E. A. Sovero and R. Sahai, Resistive Gate GaAs Charge Coupled Devices, GaAs IC Symposium, IEEE, 49–52 (1982), describes a resistive gate CCD fabricated using GaAs.

SUMMARY OF THE INVENTION

A preferred embodiment of the present invention in a first aspect is a detector device for measuring the intensity of electromagnetic radiation, comprising a body of semiconductor material having a region of a first conductivity type and a channel of a second, opposite, conductivity type formed at one surface of the body and bounded by the region of the first conductivity type. The semiconductor material responds to electromagnetic radiation in a given spectral region by generating charge carriers. Charge carriers that are created in or diffuse into the channel are confined in the channel. A charge-coupled device is formed in the body of semiconductor material and has a charge collection well adjacent to an end of the channel. A layer of resistive material is disposed over the surface of the body of semiconductor material, the layer having two terminal regions such that when opposite terminals of a DC potential source are connected to those terminal regions, an electric field that extends longitudinally of the channel is created, so that charge carriers in the channel diffuse along the channel towards the charge-coupled device.

A preferred embodiment of the present invention in a second aspect is an interferometer comprising an optical system for generating an interference pattern of a predetermined configuration in a focal plane of the interferometer, and a detector device for measuring the distribution of optical power over said focal plane. The detector device comprises a body of semiconductor material having first and second opposite main surfaces, one of which surfaces lies substantially in the focal plane of the interferometer. The body of semiconductor material has a region of a first conductivity type and a channel of a second, opposite conductivity type at the first surface thereof and bounded by the region of the first conductivity type. The configuration of the channel conforms substantially to the predetermined configuration of the interference pattern. The semiconductor material responds to electromagnetic radiation in a given spectral region by generating charge carriers.

Charge carriers that are created in or diffuse into the channel are confined in the channel. A layer of dielectric material is formed on the first surface of the body of semiconductor material and overlies the channel. A layer of resistive material is disposed over the layer of dielectric material, the layer having two terminal regions such that when opposite terminals of a DC potential source are connected to those terminal regions, an electric field that extends longitudinally of the channel is created, so that charge carriers are transported along the channel to an end region thereof. An output device has a charge collection region adjacent to the end region of the channel.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
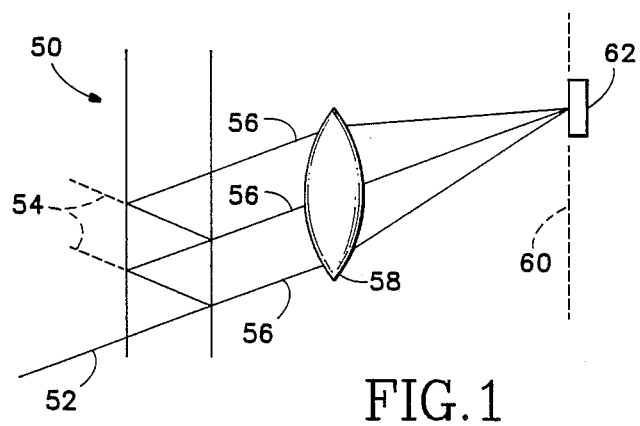
FIG. 1 illustrates schematically an interferometer including a Fabry-Perot etalon and a detector device.

The interferometer shown in FIG. 1 comprises a Fabry-Perot etalon 50 which receives a collimated light beam 52 from a source (not shown). Through successive partial reflections at the confronting surfaces of the etalon, the incident light beam 52 is divided into multiple reflected beams 54 and multiple transmitted beams 56. The transmitted beams 56 are brought to a focus by a lens 58 at a focal plane 60, and the well-known Fabry-Perot interference pattern is formed at the focal plane. A detector device 62 is positioned with an image-receiving surface at the focal plane 60.

Figure 2:
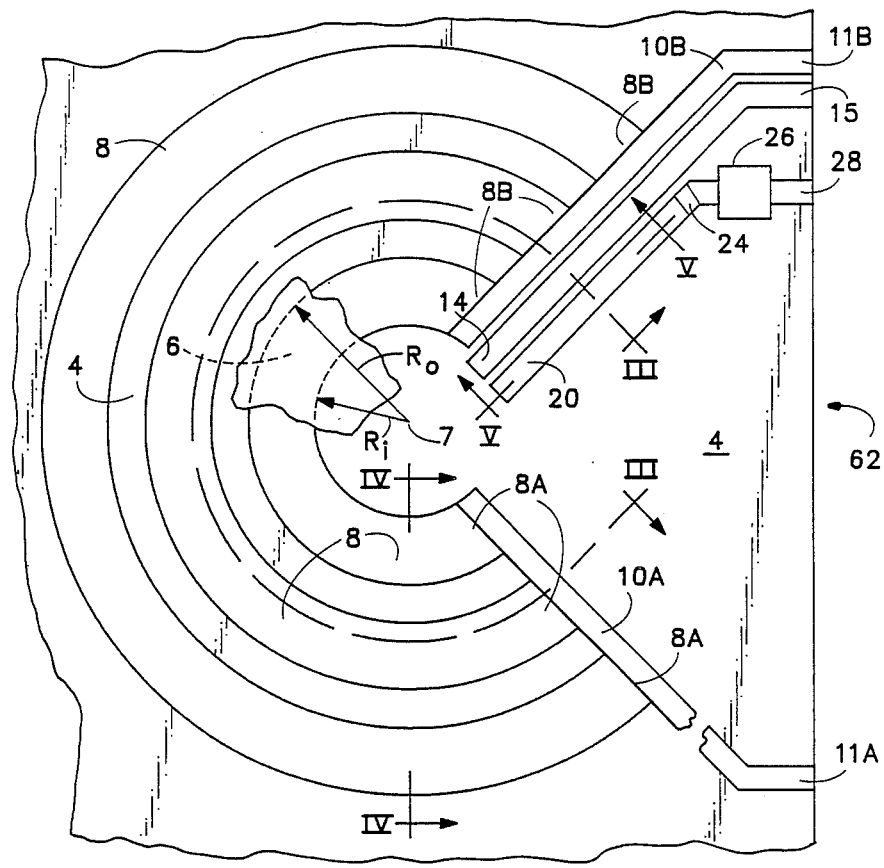
FIG. 2 is a partially cut away top plan view of the detector device.
Figure 3:
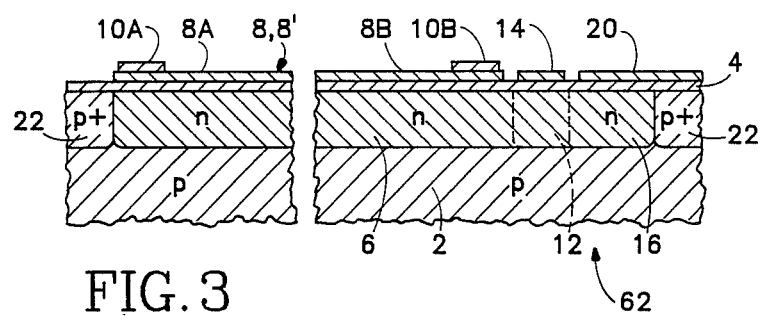
FIG. 3 is a sectional view taken on the line III—III of FIG. 2.

As shown in FIG. 3, the detector device 62 comprises a substrate 2 of p-type silicon having a layer 4 of silicon dioxide over its front surface. Buried channels 6 (see FIGS. 2 and 4) of n conductivity are formed in the substrate 2 beneath the front surface. The channels 6 are each part-annular in form (FIG. 2), have a common center 7 and have the same angular extent. The radii of the channels are, however, different. FIG. 2 shows a resistive gate electrode 8, having two opposite ends 8A and 8B, over each channel 6. The electrodes 8 are formed by deposition of InSnO and are accordingly transparent. The resistive gate electrodes 8 are laterally substantially coextensive with the channels 6 respectively. The ends 8A of the electrodes 8 are connected together by a metal conductor strip 10A which terminates in a connection pad 11A, and similarly the ends 8B are connected together by a metal conductor strip 10B which terminates in a connection pad 11B. Accordingly, a potential gradient may be established along each resistive gate electrode 8. The resistivity of the resistive gate electrode is preferably quite high, in order to minimize flow of current in the resistive gate electrode.

Figure 4:
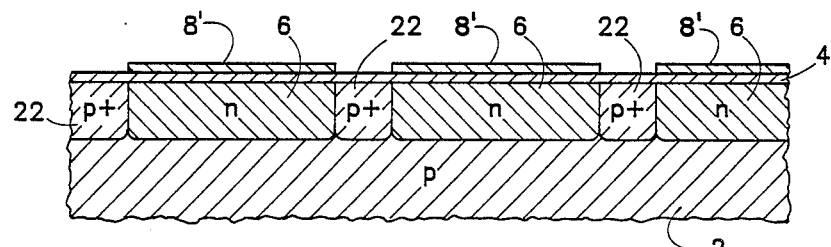
FIG. 4 is a sectional view taken on the line IV—IV of FIG. 2.

Alternatively, as shown in FIG. 4, a single, simply-connected, part-annular resistive gate electrode 8' may extend over all the channels 6. When the ends of the electrode 8' are connected to opposite terminals of a DC potential source, the resulting electric field lines are circular.

As shown in FIG. 3, each of the part-annular buried channels 6 terminates in a transfer region 12. A transfer electrode 14, which may be made of polysilicon and terminates in a connection pad 15, lies over the transfer regions 12.

Figure 5:
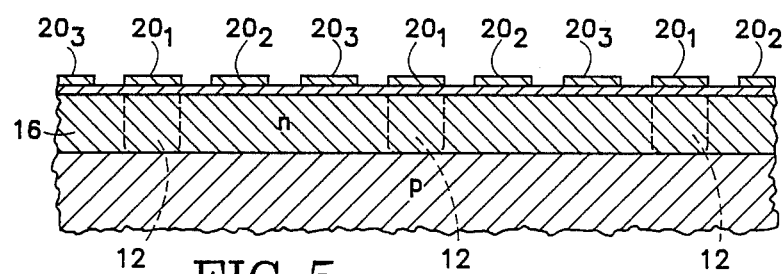
FIG. 5 is a sectional view taken on the line V—V of FIG. 2.

A rectilinear buried channel 16 (FIG. 3) of n conductivity extends substantially radially with respect to the part-annular channels 6 and communicates with the transfer regions 12. Channel stop regions 22 (FIGS. 3 and 4) of p+ conductivity bound the channels 6 and 16 laterally. A clocking gate electrode structure 20, which is shown only generally in FIG. 2, lies over the buried channel 16. The channel 16 and the clocking gate electrode structure 20 form a CCD shift register. By way of example, FIG. 5 illustrates the clocking gate electrode structure as comprising three arrays of clocking gate electrodes $20_1$, $20_2$ and $20_3$. Different respective potentials may be applied to each array of electrodes by way of respective connection pads (not shown). A potential well is defined in the channel 16 beneath each clocking gate electrode, the potential depth of each well depending on the potential of the corresponding electrode. By applying appropriate potentials to the clocking gate electrodes, a charge sample in the potential well beneath a given electrode can be shifted along the channel 16 in orderly fashion to an output node 24, where it may be applied to the gate electrode of a field-effect transistor amplifier 26 and thereby enable an output signal to be provided at a connection pad 28.

As shown in FIG. 5, in which the transfer regions 12 are illustrated in dashed lines because they are out of the plane of the section, the clocking gate electrodes $20_1$, $20_2$ and $20_3$ are positioned along the channel 16 such that there is an electrode $20_1$ over the channel 16 where it communicates with a transfer region 12.

The front surface of the detector device shown in FIGS. 2-5 is its image-receiving surface. Accordingly, the transmitted beams of the etalon are brought to a focus on the front surface of the device, and a pattern of concentric interference fringes is formed on the front surface. The device is positioned so that the center of the interference pattern lies at the point 7. The mean radius of each part-annular channel 6, i.e., the average of the radius $R_i$ of its inner periphery and the radius $R_O$ of its outer periphery, is equal to the radius of the circular locus of points on which one of the rings of the interference pattern has maximum intensity when the etalon is illuminated with light of a predetermined wavelength. When the etalon is illuminated in this fashion, the interference fringes are imaged on the buried channels 6 respectively, and cause conduction electrons to be generated in the substrate.

The operating cycle of the detector device has three periods: an integration period, a transfer period and a readout period. During the integration period, the ends 8A and 8B of the electrodes 8 (or of the single electrode 8') are maintained at 0 v and a positive potential, e.g., +10 v, respectively, the electrodes $20_1$, $20_2$ and $20_3$ of the clocking gate electrode structure 20 are maintained at 0 v and the transfer gate electrode 14 is maintained at a more positive potential than the end 8B, e.g., +15 v. Conduction electrons that are generated in the substrate 2 diffuse into and are confined in the buried channels 6, and the potential gradient existing along the electrodes 8 (or electrode 8') results in the conduction electrons being transported along the channels 6 in the clockwise direction seen in FIG. 2. Since the transfer gate electrode 14 is at a higher positive potential than the end 8B, the conduction electrons that are transported along the channels accumulate in the transfer regions 12 as respective charge samples.

The transfer period occurs after the integration period. In the transfer period, the end 8B of each resistive gate electrode 8 (or of the single electrode 8') is placed at 0 v, the electrodes $20_1$ of the CCD shift register are brought to +15 v (the electrodes $20_2$ and $20_3$ remain at 0 v) and the transfer gate electrode 14 is brought to +10 v. The charge sample accumulated in a given transfer region 12 is then transferred to the potential well beneath the corresponding electrode $20_1$.

In the readout period, the clocking gate electrodes are clocked and the charge samples are shifted through the channel 16 to the output node of the CCD shift register, providing a sampled output signal of which the magnitude depends on the intensity with which the channels 6 were illuminated during the integration period.

The energy flux of each fringe of the interference pattern generated by a Fabry-Perot etalon is the same, and therefore if the etalon were illuminated with light of the predetermined wavelength, the charge sample that accumulated in each transfer region 12 during the integration period would be the same and the magnitude of the output signal provided by the CCD shift register during the readout period would be constant. However, when the etalon is illuminated with light of a slightly different wavelength, the intensity maxima of the interference fringes are not centered on the channels 6, and accordingly the magnitude of the output signal of the CCD shift register during the readout period has an AC component, and the frequency of the AC component depends on the difference between the predetermined wavelength and the wavelength of the light with which the optical system was illuminated.

It will be appreciated that certain conventional features of CCD structures have not been shown in the drawings in order to facilitate illustration of features that are pertinent to the invention. For example, in a practical embodiment of the invention, the transfer gate electrode 14 would overlap the clocking gate electrodes, and the clocking gate electrodes would overlap one another, in order to avoid creation of potential barriers between the transfer region 12 and the channel 16 and along the channel 16.

It will also be appreciated that the present invention is not restricted to the particular embodiment that has been described and illustrated, and that variations may be made therein without departing from the scope of the invention as defined in the appended claims and equivalents thereof. For example, it is not essential to the invention that the device be illuminated from its front surface. The die may be thinned from its back surface (the surface opposite the front surface) and illuminated from the back surface. Back surface illumination avoids the need to use a transparent material for the resistive gate electrode, but potentially gives rise to error due to conduction electrons diffusing into the buried channel of the shift register during the integration period. This source of error can be eliminated by providing a layer of opaque material, e.g., aluminum, over the back surface of the die, except over the buried channels 6. Also, the invention is not limited to use with a CCD shift register having a clocking gate electrode structure with three arrays of clocking gate electrodes, since clocking gate electrode structures with other than three arrays of electrodes would be suitable. Moreover, it is not essential to the invention that a transfer region be used to receive the charge that has been transported along the part-annular buried channels during the integration period, since the charge may be placed directly in the buried channel of the CCD shift register. Of course, this requires that the clocking gate electrodes of the shift register be maintained at proper potentials during the integration period. The invention is not limited to the charge transfer channels being buried in the die, since surface channels may be used alternatively. The channel at each radial position need not be in a single sector. Each channel may be split into multiple sectors feeding respective CCD shift registers. The invention is not restricted to use with an optical system that provides circular interference fringes.

What is claimed:

1. A detector device for measuring the intensity of electromagnetic radiation in a given spectral region, comprising:
   a body of semiconductor material that responds to electromagnetic radiation in said given spectral region by generating charge carriers, the body of semiconductor material having a region of a first conductivity type and a channel of a second, opposite, conductivity type at one surface thereof and bounded by the region of said first conductivity type, the channel being part circular in configuration,
   a layer of dielectric material on said one surface of the body of semiconductor material and overlying said channel,
   a layer of resistive material on top said layer of dielectric material, the layer having two terminal regions such that when opposite terminals of a DC potential source are connected to those terminal regions, an electric field that extends longitudinally of the channel is created, so that charge carriers are transported along the channel to an end region thereof, and
   an output device having a charge collection region adjacent to said end region of the channel.

2. A detector device according to claim 1, wherein the channel is a buried channel.

3. A detector device according to claim 1, wherein the output device is a charge-coupled device shift register having a channel of said second conductivity type, the channel of the charge-coupled device shift register communicating with the first-mentioned channel and being disposed transversely to the end region thereof.

4. A detector device according to claim 3, wherein the channel of the charge-coupled device is a buried channel.

5. A detector device according to claim 3, wherein the first-mentioned channel terminates at said one end region in a transfer region, and the detector device further comprises a transfer electrode which overlies the transfer region.

6. A detector device according to claim 1, wherein the layer of resistive material comprises a strip which is substantially coextensive with the channel.

7. A detector device according to claim 1, wherein the body of semiconductor material has a plurality of channels at said one surface thereof, the channels each being part circular in configuration, and the part-circular channels being concentric and of substantially equal angular extent, and wherein the layer of resistive material overlies the plurality of channels.

8. A detector device according to claim 7, wherein the output device has a plurality of charge collection regions adjacent to end regions of the channels respectively.

9. A detector device according to claim 8, wherein the output device is a charge-coupled device shift register having a channel of said second conductivity type, the channel of the charge-coupled device shift register communicating with the first-mentioned channels and being disposed transversely to the respective end regions thereof.

10. A detector device according to claim 7, wherein the layer of resistive material comprises a plurality of strips having connected end portions, each strip overlying the respective channel.

11. A detector device according to claim 7, wherein the layer of resistive material comprises a simply connected layer which overlies all of the channels.

* * * * *